US012039923B2

(12) United States Patent
Lee et al.

(10) Patent No.: US 12,039,923 B2
(45) Date of Patent: Jul. 16, 2024

(54) EMISSION DRIVER AND DISPLAY DEVICE INCLUDING THE SAME

(71) Applicant: Samsung Display Co., LTD., Yongin-si (KR)

(72) Inventors: Su Jin Lee, Yongin-si (KR); Bon Yong Koo, Yongin-si (KR); Gyung Soon Park, Yongin-si (KR); Dan Won Lim, Yongin-si (KR); Jae Yong Jang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/328,122

(22) Filed: Jun. 2, 2023

(65) Prior Publication Data

US 2024/0046855 A1 Feb. 8, 2024

(30) Foreign Application Priority Data

Aug. 3, 2022 (KR) ........................ 10-2022-0096922

(51) Int. Cl.
*G09G 3/32* (2016.01)

(52) U.S. Cl.
CPC ........... *G09G 3/32* (2013.01); *G09G 2330/04* (2013.01)

(58) Field of Classification Search
CPC .............................. G09G 3/32; G09G 2330/04
See application file for complete search history.

(56) References Cited

U.S. PATENT DOCUMENTS

| 10,453,386 | B2 | 10/2019 | Jang | |
| 10,741,123 | B2 | 8/2020 | Moon et al. | |
| 11,151,931 | B2* | 10/2021 | Kim | G09G 3/32 |
| 11,315,459 | B2 | 4/2022 | Kong et al. | |
| 11,348,530 | B2* | 5/2022 | Choi | G09G 3/3275 |
| 11,482,179 | B2* | 10/2022 | Kim | G09G 3/3266 |
| 2016/0247479 | A1* | 8/2016 | Cho | G09G 3/3677 |
| 2017/0076684 | A1* | 3/2017 | Kim | G09G 3/3677 |
| 2017/0301295 | A1* | 10/2017 | Park | G09G 3/3258 |
| 2019/0043405 | A1* | 2/2019 | Noh | G09G 3/3674 |
| 2020/0066211 | A1* | 2/2020 | Lee | G09G 3/3225 |
| 2020/0074933 | A1* | 3/2020 | Ban | G09G 3/3283 |

(Continued)

FOREIGN PATENT DOCUMENTS

| KR | 10-1633602 | 6/2016 |
| KR | 10-2017-0079775 | 7/2017 |

(Continued)

*Primary Examiner* — David Tung
(74) *Attorney, Agent, or Firm* — KILE PARK REED & HOUTTEMAN PLLC

(57) ABSTRACT

An emission driver includes stages including a first group of stages. Each of the stages of the first group among the stages include a first carry signal output component that outputs a carry signal having a turn-on level based on a voltage of a first node, and outputs the carry signal having a turn-off level based on a voltage of a second node; a first emission signal output component that outputs an emission signal having a turn-on level based on the voltage of the first node, and outputs the emission signal having a turn-off level based on the voltage of the second node; a first node voltage setting component that sets the voltage of the first node; and a second node voltage setting component that sets the voltage of the second node.

18 Claims, 11 Drawing Sheets

(56) References Cited

U.S. PATENT DOCUMENTS

| | | | |
|---|---|---|---|
| 2020/0135115 A1* | 4/2020 | Chang | G09G 3/3291 |
| 2022/0199034 A1* | 6/2022 | Yun | G09G 3/3266 |
| 2022/0208109 A1* | 6/2022 | Seo | G09G 3/3266 |
| 2023/0140806 A1 | 5/2023 | In et al. | |

FOREIGN PATENT DOCUMENTS

| | | |
|---|---|---|
| KR | 10-2019-0035110 | 4/2019 |
| KR | 10-2019-0073111 | 6/2019 |
| KR | 10-2023-0064697 | 5/2023 |

\* cited by examiner

EMISSION DRIVER AND DISPLAY DEVICE INCLUDING THE SAME

CROSS-REFERENCE TO RELATED APPLICATION(S)

This application claims priority to and benefits of Korean patent application number 10-2022-0096922 under 35 U.S.C. § 119 filed on Aug. 3, 2022 in the Korean Intellectual Property Office, the entire contents of which are incorporated herein by reference.

BACKGROUND

1. Technical Field

Various embodiments relate to an emission driver and a display device including the emission driver.

2. Description of the Related Art

With the development of information technology, the importance of a display device, which is a connection medium between a user and information, has been emphasized. Owing to the importance of display devices, the use of various kinds of display devices, such as a liquid crystal display device and an organic light-emitting display device, has increased.

Each display device may include pixels to display an image, and an emission driver that provides emission signals for determining emission timings of the pixels. Each stage of the emission driver may include transistors. The transistors are required to be accurately turned on or off to provide ideal emission signals.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Various embodiments are directed to an emission driver which can be operated normally even if a threshold voltage of an internal transistor is negatively shifted and a display device including the emission driver.

An embodiment may include an emission driver including stages including a first group of stages. Each of the stages of the first group among the stages may include a first carry signal output component that outputs a carry signal having a turn-on level based on a voltage of a first node, and outputs the carry signal having a turn-off level based on a voltage of a second node; a first emission signal output component that outputs an emission signal having a turn-on level based on the voltage of the first node, and outputs the emission signal having a turn-off level based on the voltage of the second node; a first node voltage setting component that sets the voltage of the first node based on a preceding carry signal or an emission stop signal, the voltage of the second node, and a first clock signal; and a second node voltage setting component that sets the voltage of the second node based on the voltage of the first node, a second clock signal, and a first auxiliary clock signal. The first clock signal and the second clock signal may be identical in cycle and are different in phase. The first clock signal and the first auxiliary clock signal may be identical in cycle and phase and be different in a voltage level of at least one logic level.

The first clock signal and the first auxiliary clock signal may be different in a voltage level of a logic low level.

The voltage level of the logic low level of the first auxiliary clock signal may be greater than the voltage level of the logic low level of the first clock signal.

Each of the stages of the first group among the stages may further include a leakage current interrupter that interrupts a leakage current path connected to the first node, based on the voltage of the first node.

The leakage current path may be located in the first node voltage setting component.

Each of the stages of the first group among the stages may further include a reset component that resets the voltage of the first node based on a reset signal.

Each of the stages of the first group among the stages may further include a path selector that selects at least one path between the first node and the first carry signal output component or the first emission signal output component and conducts electricity through the selected at least one path.

Each of the stages of the first group among the stages may further include a voltage booster that boosts, based on the second clock signal, a voltage of the at least one path selected by the path selector.

Each of stages of a second group among the stages may include a second carry signal output component that outputs a carry signal having a turn-on level based on a voltage of a third node, and outputs the carry signal having a turn-off level based on a voltage of a fourth node; a second emission signal output component that outputs an emission signal having a turn-on level based on the voltage of the third node, and outputs the emission signal having a turn-off level based on the voltage of the fourth node; a third node voltage setting component that sets the voltage of the third node based on a preceding carry signal, the voltage of the fourth node, and the second clock signal; and a fourth node voltage setting component that sets the voltage of the fourth node based on the voltage of the third node, the first clock signal, and a second auxiliary clock signal. The second clock signal and the second auxiliary clock signal may be identical in cycle and phase and be different in a voltage level of at least one logic level.

The stages of the first group and the stages of the second group may be alternately arranged.

The second clock signal and the second auxiliary clock signal may be different in a voltage level of a logic low level.

The voltage level of the logic low level of the second auxiliary clock signal may be greater than the voltage level of the logic low level of the second clock signal.

An embodiment may include an emission driver including stages of a first group among the stages. Each of the stages of the first group among the stages may include a first carry signal output component that outputs a carry signal having a turn-on level based on a voltage of a first node, and outputs the carry signal having a turn-off level based on a voltage of a second node; a first emission signal output component that outputs an emission signal having a turn-on level based on the voltage of the first node, and outputs the emission signal having a turn-off level based on the voltage of the second node; a first node voltage setting component that sets the voltage of the first node based on a preceding carry signal or an emission stop signal, the voltage of the second node, and a first clock signal; a first control signal provider that provides a first control signal having a first level based on the first clock signal, and provides the first control signal having a second level based on a second clock signal; and a second node voltage setting component that sets the voltage of the second node based on the voltage of the first node, the second clock signal, and the first control signal. The first clock signal and the second clock signal may be identical in cycle and are different in phase. The first clock signal and the first control signal may be identical in cycle and phase and be different in a voltage level of at least one logic level.

The first clock signal and the first control signal may be different in a voltage level of a logic low level.

The voltage level of the logic low level of the first control signal may be greater than the voltage level of the logic low level of the first clock signal.

Each of stages of a second group among the stages may further include a second carry signal output component that outputs a carry signal having a turn-on level based on a voltage of a third node, and outputs the carry signal having a turn-off level based on a voltage of a fourth node; a second emission signal output component that outputs an emission signal having a turn-on level based on the voltage of the third node, and outputs the emission signal having a turn-off level based on the voltage of the fourth node; a third node voltage setting component that sets the voltage of the third node based on a preceding carry signal, the voltage of the fourth node, and the second clock signal; a second control signal provider that provides a second control signal having a first level based on the second clock signal, and provides the second control signal having a second level based on the first clock signal; and a fourth node voltage setting component that sets the voltage of the fourth node based on the voltage of the third node, the first clock signal, and the second control signal. The second clock signal and the second control signal may be identical in cycle and phase and are different in a voltage level of at least one logic level.

The stages of the first group and the stages of the second group may be alternately arranged.

The second clock signal and the second control signal may be different in a voltage level of a logic low level.

The voltage level of the logic low level of the second control signal may be greater than the voltage level of the logic low level of the second clock signal.

The first control signal and the second control signal may be identical in cycle and are different in phase.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
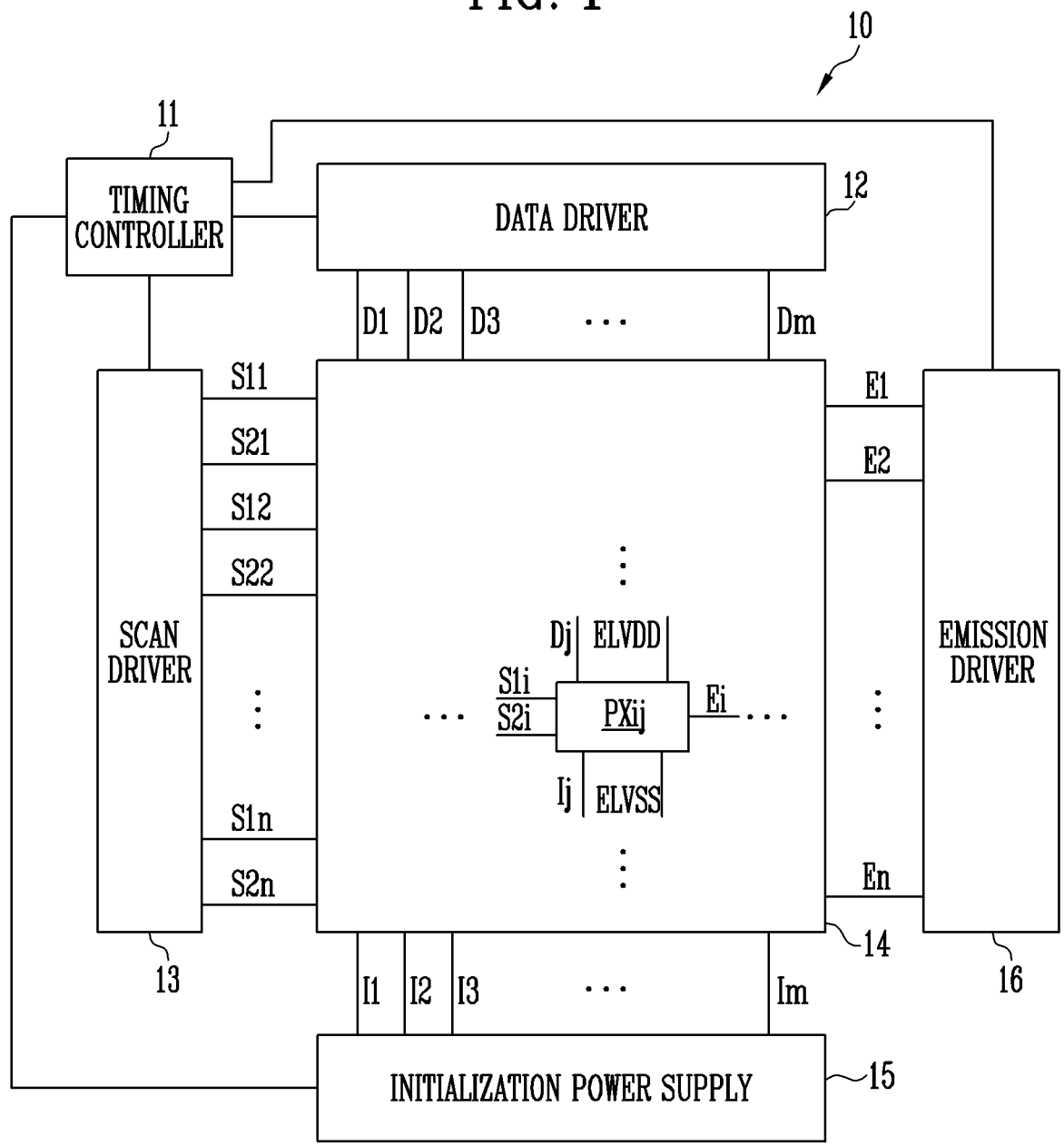
FIG. 1 is a schematic diagram for describing a display device in accordance with an embodiment.

Hereinafter, embodiments will be described in detail with reference to the attached drawings, such that those skilled in the art can readily implement the disclosure. The disclosure may be implemented in various forms, and is not limited to the embodiments to be described herein below.

In the drawings, portions which may not be related to the disclosure may be omitted in order to explain the disclosure more clearly. Reference should be made to the drawings, in which similar reference numerals are used throughout the different drawings to designate similar components. Therefore, the aforementioned reference numerals may be used in other drawings.

For reference, the size of each component and the thicknesses of lines illustrating the component are arbitrarily represented for the sake of explanation, and the disclosure is not limited to what is illustrated in the drawings. In the drawings, the thicknesses of the components may be exaggerated to clearly depict multiple layers and areas.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, the expression "being the same" may mean "being substantially the same". In other words, the expression "being the same" may include a range that can be understood by those skilled in the art. The other expressions may also be expressions from which "substantially" has been omitted.

FIG. 1 is a schematic diagram for describing a display device 10 in accordance with an embodiment.

Referring to FIG. 1, the display device 10 in accordance with an embodiment may include a timing controller 11, a data driver 12, a scan driver 13, a pixel component 14, an initialization power supply 15, and an emission driver 16.

The timing controller 11 may receive frame information and control signals from an external processor. The timing controller 11 may convert the received frame information and the received control signals to frame information and control signals that are suitable for specifications of the display device 10, and provide the converted frame information and the converted control signals to the data driver 12, the scan driver 13, and the emission driver 16. For example, the timing controller 11 may provide grayscale values and control signals for respective pixels of the pixel component 14 to the data driver 12. Furthermore, the timing controller 11 may provide control signals such as a clock signal and a scan start signal to the scan driver 13. Furthermore, the timing controller 11 may provide control signals such as a clock signal and an emission stop signal to the emission driver 16.

The data driver 12 may generate data voltages to be provided to data lines D1, D2, D3, . . . , Dj, . . . , Dm using the grayscale values and the control signals that are received from the timing controller 11. Here, m is an integer greater than 0.

The scan driver 13 may receive control signals such as a clock signal and a scan start signal from the timing controller 11 and generate first scan signals to be provided to first scan lines S11, S12, . . . , S1$i$, S1$n$ and second scan signals to be provided to second scan lines S21, S22, . . . , S2$i$, . . . , S2$n$. Here, n is an integer greater than 0.

The emission driver 16 may receive control signals such as a clock signal and an emission stop signal from the timing controller 11 and generate emission signals to be provided to emission lines E1, E2, . . . , Ei, . . . , En.

The initialization power supply 15 may supply an initialization voltage to the initialization lines I1, I2, I3, . . . , Ij, . . . , Im.

The pixel component 14 includes pixels. For example, the pixel PXij may be connected to the corresponding data line Dj, the corresponding first scan line S1$i$, the corresponding second scan line S2$i$, the corresponding emission line Ei, and the corresponding initialization line Ij. Pixels connected to an identical scan line and an identical emission line may be referred to as a pixel row. The pixels may be connected in common to the first power line ELVDD and the second power line ELVSS.

Figure 2:
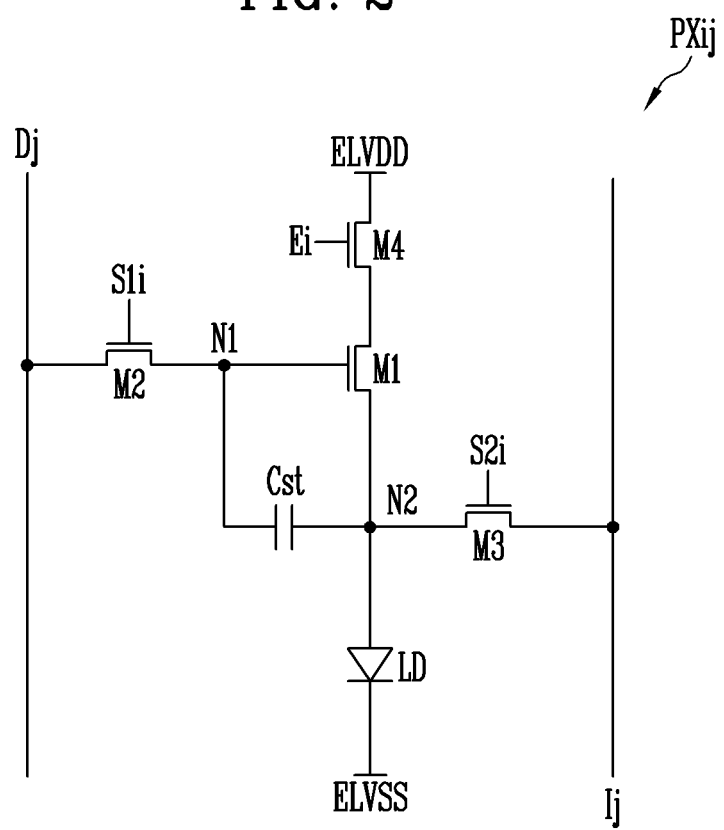
FIG. 2 is a schematic diagram for describing a pixel in accordance with an embodiment.

FIG. 2 is a schematic diagram for describing a pixel PXij in accordance with an embodiment.

Referring to FIG. 2, the pixel PXij in an embodiment may include transistors M1, M2, M3, and M4, a storage capacitor Cst, and a light emitting element LD.

Hereinafter, although it is assumed that the transistors M1 to M4 are formed of N-type transistors (for example, NMOS), those skilled in the art will understand that the transistors M1 to M4 may be formed of P-type transistors (for example, PMOS) or a combination of an N-type transistor and a P-type transistor.

The transistor M1 may include a gate electrode connected to a node N1, a first electrode connected to a node N2, and a second electrode connected to a first electrode of the transistor M4. The transistor M1 may be referred to as a driving transistor.

The transistor M2 may include a gate electrode connected to the first scan line S1$i$, a first electrode connected to the data line Dj, and a second electrode connected to the node N1. The transistor M2 may be referred to as a scan transistor, a switching transistor, or the like within the spirit and the scope of the disclosure.

The transistor M3 may include a gate electrode connected to the second scan line S2$i$, a first electrode connected to the node N2, and a second electrode connected to the initialization line Ij. The transistor M3 may be referred to as an initialization transistor.

The transistor M4 may include a gate electrode connected to the emission line Ei, a first electrode connected to the second electrode of the transistor M1, and a second electrode connected to the first power line ELVDD. The transistor M4 may be referred to as an emission control transistor.

The storage capacitor Cst may include a first electrode connected to the node N1, and a second electrode connected to the node N2.

The light emitting element LD may include an anode connected to the node N2, and a cathode connected to the second power supply line ELVSS. The light emitting element LD may be formed of a light emitting diode. For example, the light emitting element LD may be formed of an organic light emitting diode, an inorganic light emitting diode, a quantum dot light emitting diode, or the like within the spirit and the scope of the disclosure.

Although FIG. 2 illustrates only one light emitting element LD, the light emitting element LD may be formed of subminiature light emitting elements. For instance, the subminiature light emitting elements may be connected in series, parallel, or series-parallel to each other.

Figure 3:
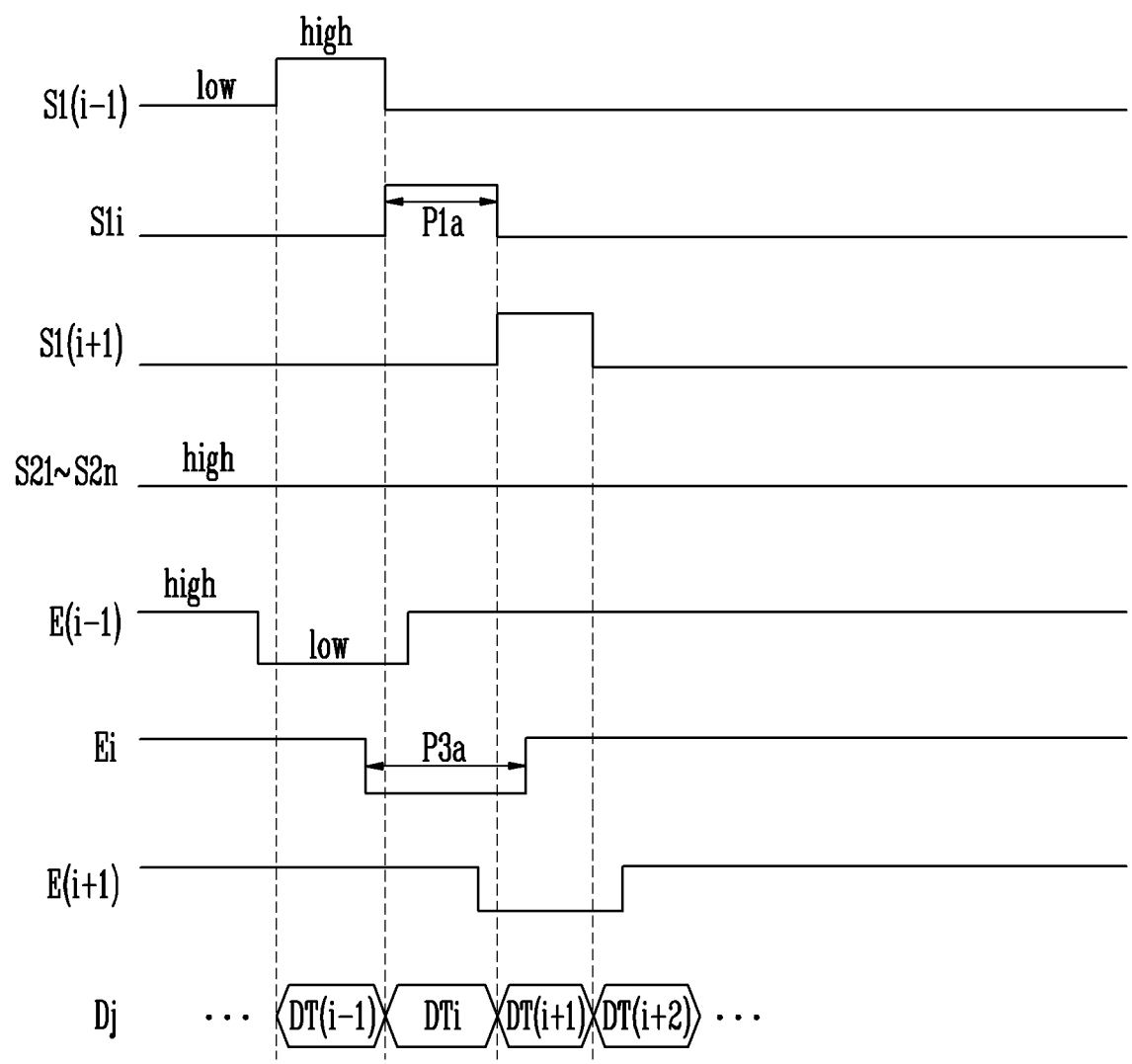
FIG. 3 is a schematic diagram for describing an example of a method of driving the pixel of FIG. 2.

FIG. 3 is a schematic diagram for describing an example of a method of driving the pixel of FIG. 2.

Referring to FIG. 3, during a period P1a, a first scan signal having a turn-on level (for example, a logic high level) may be applied to the first scan line S1i, a data voltage DTi may be applied to the data line Dj, and a second scan signal having a turn-on level (for example, a logic high level) may be applied to the second scan line S2i.

During a period P3a, an emission signal having a turn-off level (for example, a logic low level) may be applied to the emission line Ei. The period P3a may be a period including the period P1a. The light emitting element LD may emit light at a luminance based on a data voltage in case that an emission signal having a turn-on level (for example, a logic high level) is applied to the emission line Ei, and may be in a non-emission state in case that an emission signal having a turn-off level is applied to the emission line Ei.

Referring to FIG. 3, the first scan signals each having a turn-on level may be successively supplied to the first scan lines S1(i−1), S1i, and S1(i+1). Furthermore, the second scan signals each having a turn-on level may be maintained in the second scan lines S21 to S2n. In an embodiment, the second scan signals each having a turn-on level may be successively supplied to the second scan lines S21 to S2n. Here, the second scan signals each having a turn-on level may be synchronized with the first scan signals each having a turn-on level.

For example, if a first scan signal having a turn-on level is applied to the first scan line S1i, the transistor M2 of the pixel PXij may be turned on, and a data voltage may be applied to the node N1. Furthermore, if a second scan signal having a turn-on level is applied to the second scan line S2i, the transistor M3 of the pixel PXij may be turned on, and an initialization voltage may be applied to the node N2. Hence, the storage capacitor Cst may store a difference in voltage between the node N1 and the node N2. Here, because an emission signal having a turn-off level is applied to the emission line Ei, the transistor M4 may be in a turned-off state, so that a driving current does not flow from the first power line ELVDD to the second power line ELVSS. Therefore, the light emitting element LD may be in a non-emission state. In order to compare signal timings, FIG. 3 further includes emission signals applied on emission lines E(i−1) and E(i+1) as well as data voltages DT(i−1), DT(i+1), and DT(i+2).

An emission signal having a turn-on level may be applied to the emission line Ei. Because the transistor M4 is in a turned-on state, driving current may flow from the first power line ELVDD to the second power line ELVSS. Here, the amount of driving current may be adjusted by the transistor M1 depending on a voltage difference stored in the storage capacitor Cst Therefore, the light emitting element LD may emit light at a luminance proportional to the amount of driving current. Here, because the transistor M2 and the transistor M3 are in a turned-off state, the storage capacitor Cst may maintain the stored voltage difference.

The pixel circuit of FIG. 2 and the driving method of FIG. 3 are examples for describing how the outputted emission signals are used in embodiments. Those skilled in the art will appreciate that the embodiments can be applied to other pixel circuits.

Figure 4:
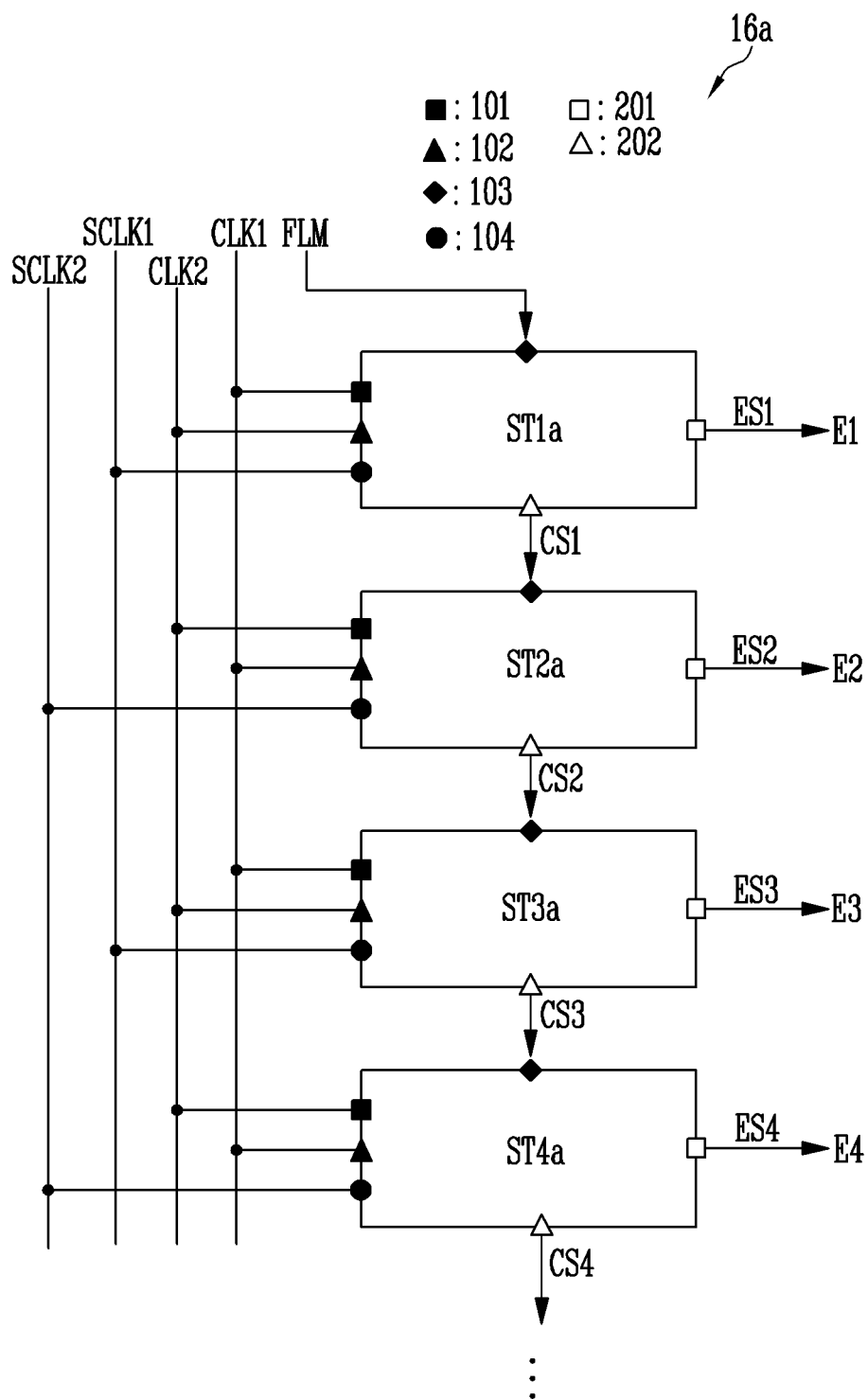
FIG. 4 is a schematic diagram for describing an emission driver in accordance with an embodiment.

FIG. 4 is a schematic diagram for describing an emission driver 16a in accordance with an embodiment.

Referring to FIG. 4, the emission driver 16a in accordance with an embodiment may include stages ST1a, ST2a, ST3a, ST4a, . . . . The stages ST1a, ST2a, ST3a, ST4a, . . . may include a first group of stages ST1a, ST3a, . . . and a second group of stages ST2a, ST4a, The stages ST1a, ST3a, . . . of the first group and the stages ST2a, ST4a, . . . of the second group may be alternately arranged (or connected). For example, the stages ST1a, ST3a, . . . of the first group may be odd numbered stages, and the stages ST2a, ST4a, . . . of the second group may be even numbered stages. Signals that are supplied in common to the stages ST1a, ST2a, ST3a, ST4a, . . . are not separately illustrated in FIG. 4.

Each of the stages ST1a, ST3a, . . . of the first group may receive a first clock signal CLK1 through a first input terminal 101, receive a second clock signal CLK2 through a second input terminal 102, receive a preceding carry signal or an emission stop signal FLM through a third input terminal 103, and receive a first auxiliary clock signal SCLK1 through a fourth input terminal 104. For example, the first stage ST1a among the stages ST1a, ST3a, . . . of the first group may receive an emission stop signal FLM through the third input terminal 103, and each of the other stages ST3a, . . . may receive a preceding carry signal through the third input terminal 103. Each of the stages ST1a, ST3a, . . . of the first group may output an emission signal through a first output terminal 201, and output a carry signal through a second output terminal 202.

Each of the stages ST2a, ST4a, . . . of the second group may receive a second clock signal CLK2 through a first input terminal 101, receive a first clock signal CLK1 through a second input terminal 102, receive a preceding carry signal through a third input terminal 103, and receive a second auxiliary clock signal SCLK2 through a fourth input terminal 104. Each of the stages ST2a, ST4a, . . . of the second group may output an emission signal through a first output terminal 201, and output a carry signal through a second output terminal 202.

Figure 5:
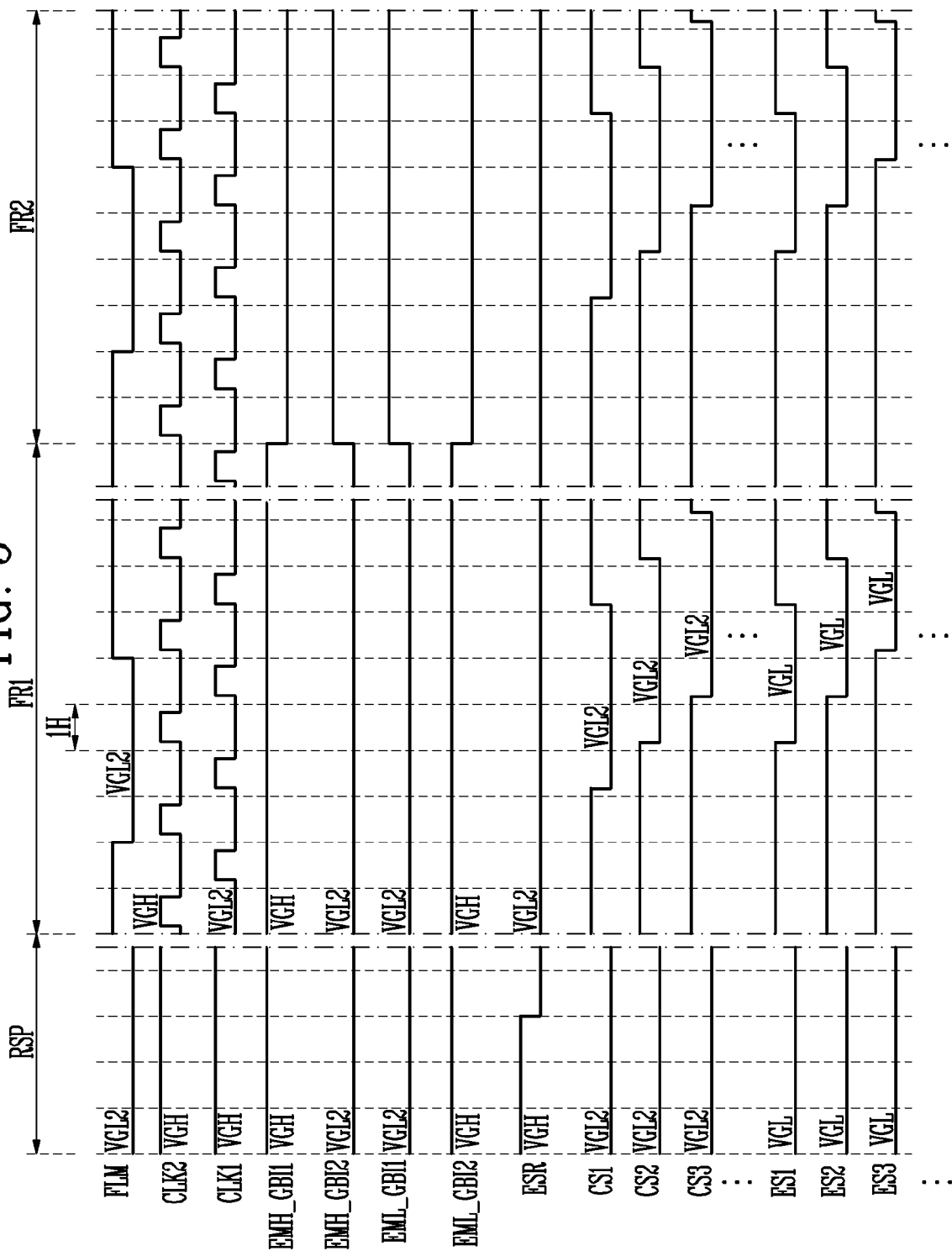
FIG. 5 is a schematic diagram for describing the overall operation of the emission driver of FIG. 4.

FIG. 5 is a schematic diagram for describing the overall operation of the emission driver of FIG. 4.

Referring to FIG. 5, during a reset period RSP, for example, in case that the display device 10 is powered on, a reset signal ESR having a turn-on level may be supplied to the stages ST1a, ST2a, ST3a, ST4a, . . . . The turn-on level of the reset signal ESR may correspond to a first voltage VGH. The turn-off level of the reset signal ESR may correspond to a second voltage VGL2. In FIG. 5, the reset signal ESR may be maintained at the turn-on level during a specific or given period (for example, a third horizontal period), and thereafter, be maintained at the turn-off level.

During the reset period RSP, the emission stop signal FLM may be maintained at a turn-off level (for example, the second voltage VGL2), and the clock signals CLK1 and CLK2 may be maintained at a turn-on level (for example, the first voltage VGH). Therefore, during the reset period RSP, first nodes Q of all of the stages ST1a, ST2a, ST3a, ST4a, . . . may be maintained at a turn-off level, and carry signals CS1, CS2, CS3, . . . and emission signals ES1, ES2, ES3, . . . may be maintained at a turn-off level.

For example, path select signals EMH_GBI1 and EML_GBI2 may be set to a turn-on level (for example, the first voltage VGH), and path select signals EMH_GBI2 and EML_GBI1 may be set to a turn-off level (for example, the second voltage VGL2). By way of example, the path select signals EMH_GBI2, EML_GBI1 may be set to a turn-on level (for example, the first voltage VGH), and path select signals EMH_GBI1 and EML_GBI2 may be set to a turn-off level (for example, the second voltage VGL2). As a further example, the path select signals EMH_GBI1 and EMH_GBI2 may be set to a turn-on level, and the path select signals EML_GBI1 and EML_GBI2 may be set to a turn-off level. As such, the path select signals EMH_GBI1, EMH_GBI2, EML_GBI1 and EML_GBI2 may be relatively arbitrarily set.

During frame periods FR1 and FR2 after the reset period RSP, the reset signal ESR may be maintained at a turn-off level.

During the frame periods FR1 and FR2, the first clock signal CLK1 and the second clock signal CLK2 may be signals that have the same cycle and different phases. For example, the cycle of the first clock signal CLK1 and the second clock signal CLK2 may be two horizontal periods. A difference in phase between the first clock signal CLK1 and the second clock signal CLK2 may be about 180°. For example, the first clock signal CLK1 and the second clock signal CLK2 may include turn-on level pulses each having a length of an approximately one horizontal period 1H, and the pulses of the first clock signal CLK1 and the second clock signal CLK2 may not overlap each other. The turn-on level of the first clock signal CLK1 and the second clock signal CLK2 may correspond to the first voltage VGH. The turn-off level of the first clock signal CLK1 and the second clock signal CLK2 may correspond to the second voltage VGL2.

The emission stop signal FLM may be maintained at a turn-on level during most part of each frame period, and may include a pulse having a turn-off level at an initial stage of each frame period. Although FIG. 5 illustrates that the length of the pulse having a turn-off level corresponds to four horizontal periods, the length may be changed depending on embodiments. The turn-on level of the emission stop signal FLM may correspond to the first voltage VGH. The turn-off level of the emission stop signal FLM may correspond to the second voltage VGL2.

The path select signals EMH_GBI1, EMH_GBI2, EML_GBI1 and EML_GBI2 will be described below with reference to FIGS. 6 and 7. The turn-on level of the path select signals EMH_GBI1, EMH_GBI2, EML_GBI1 and EML_GBI2 may correspond to the first voltage VGH. The turn-off level of the path select signals EMH_GBI1, EMH_GBI2, EML_GBI1, and EML_GBI2 may correspond to the second voltage VGL2.

In each of the frame periods FR1, FR2, . . . , the stages ST1a, ST2a, ST3a, ST4a, . . . may sequentially output the carry signals CS1, CS2, CS3, . . . each having a turn-off level and the emission signals ES1, ES2, ES3, . . . each having a turn-off level. The turn-on level of the carry signals CS1, CS2, CS3, . . . may correspond to the first voltage VGH. The turn-off level of the carry signals CS1, CS2, CS3, . . . may correspond to the second voltage VGL2. The turn-on level of the emission signals ES1, ES2, ES3, . . . may correspond to the first voltage VGH. The turn-off level of the emission signals ES1, ES2, ES3, . . . may correspond to a third voltage VGL.

The third voltage VGL may be greater than the second voltage VGL2. Both the second voltage VGL2 and the third voltage VGL may correspond to a logic low level. In embodiments, the second voltage VGL2 and the third voltage VGL have a difference in voltage, so that a difference in gate-source voltage between some or a number of transistors in the stages ST1a, ST2a, ST3a, ST4a, . . . may be set to a negative number rather than 0, whereby the corresponding transistors can be reliably turned off.

Figure 6:
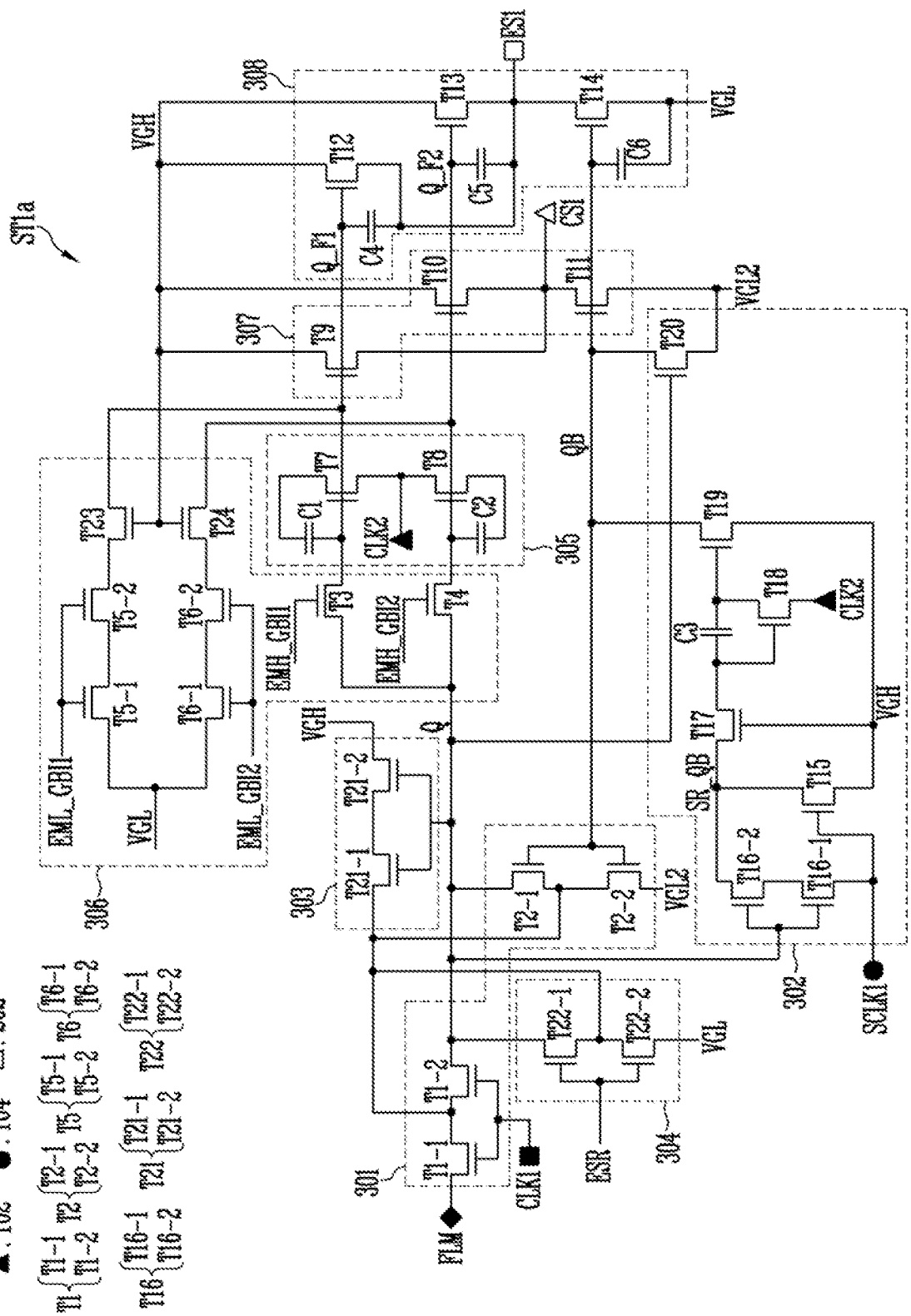
FIG. 6 is a schematic diagram for describing a stage in accordance with an embodiment.

FIG. 6 is a schematic diagram for describing a stage in accordance with an embodiment.

Referring to FIG. 6, the stage ST1a in accordance with an embodiment may include a first node voltage setting component 301, a second node voltage setting component 302, a leakage current interrupter 303, a reset component 304, a voltage booster 305, a path selector 306, a carry signal output component 307, and an emission signal output component 308. Hereinafter, although the first stage ST1a of the first group will be described as a representative example, the other stages ST3a, . . . of the first group and the stages ST2a, ST4a, . . . of the second group may have the same structure as that of the first stage ST1a. As described with reference to FIG. 4, signals to be inputted to the input terminals 101, 102, 103, and 104 may be changed for each of the stages ST1a, ST2a, ST3a, ST4a, . . . .

The first node voltage setting component 301 may set a voltage of a first node Q based on a preceding carry signal (or an emission stop signal FLM), a voltage of a second node QB, and a first block signal CLK1. The first node voltage setting component 301 may include a first transistor T1 and a second transistor T2. The first transistor T1 may include sub-transistors T1-1 and T1-2 connected in series to each other. The second transistor T2 may include sub-transistors T2-1 and T2-2 connected in series to each other.

The first transistor T1 may include a first electrode connected to the third input terminal 103, a second electrode connected to the first node Q, and a gate electrode connected to the first input terminal 101. The second transistor T2 may include a first electrode connected to the first node Q, a second electrode that receives the second voltage VGL2, and a gate electrode connected to the second node QB.

The second node voltage setting component 302 may set a voltage of the second node QB based on the voltage of the first node Q, a second clock signal CLK2, and a first auxiliary clock signal SCLK1. The second node voltage setting component 302 may include a fifteenth transistor T15, a sixteenth transistor T16, a seventh transistor T17, an eighteenth transistor T18, a nineteenth transistor T19, and a third capacitor C3. The sixteenth transistor T16 may include sub-transistors T16-1 and T16-2 connected in series to each other.

The fifteenth transistor T15 may include a first electrode connected to a node SR_QB, a second electrode that receives the first voltage VGH, and a gate electrode connected to the fourth input terminal 104. The sixteenth transistor T16 may include a first electrode connected to the node SR_QB, a second electrode connected to the fourth input terminal 104, and a gate electrode connected to the first node Q. The seventeenth transistor T17 may include a first electrode connected to the node SR_QB, a second electrode connected to a first electrode of the third capacitor C3, and a gate electrode that receives the first voltage VGH. The eighteenth transistor T18 may include a first electrode connected to a second electrode of the third capacitor C3, a second electrode connected to the second input terminal 102, and a gate electrode connected to the first electrode of the third capacitor C3. The nineteenth transistor T19 may include a first electrode connected to the second node QB, a second electrode that receives the first voltage VGH, and a gate electrode connected to the first electrode of the eighteenth transistor T18. The third capacitor C3 may be connected or coupled between the gate electrode of the eighteenth transistor T18 and the first electrode.

The leakage current interrupter 303 may interrupt a leakage current path connected to the first node Q, based on the voltage of the first node Q. The leakage current path may be located in the first node voltage setting component 301. Furthermore, the leakage current path may be located in the reset component 304. For example, the leakage current path may include a path between the first electrode and the second electrode of the first transistor T1, a path between the first electrode and the second electrode of the second transistor T2, and a path between a first electrode and a second electrode of a twenty-second transistor T22. In case that the first node Q is at a logic high level, the leakage current interrupter 303 may supply the first voltage VGH between the sub-transistors T1-1 and T1-2 of the first transistor T1, supply the first voltage VGH between the sub-transistors T2-1 and T2-2 of the second transistor T2, and supply the first voltage VGH between sub-transistors T22-1 and T22-2 of the twenty-second transistor T22, so that leakage current can be blocked from flowing from the first node Q, whereby the first node Q can be maintained at the logic high level. The leakage current interrupter 303 may include a twenty-first transistor T21. The twenty-first transistor T21 may include sub-transistors T21-1 and T21-2 connected in series to each other.

The twenty-first transistor T21 may include a first electrode which is connected to a node between the sub-transistors T1-1 and T1-2 of the first transistor T1, a node between the sub-transistors T2-1 and T2-2 of the second transistor T2, and a node between the sub-transistors T22-1 and T22-2 of the twenty-second transistor T22, a second electrode that receives the first voltage VGH, and a gate electrode connected to the first node Q.

The reset component 304 may reset the voltage of the first node Q based on a reset signal ESR. The reset component 304 may include the twenty-second transistor T22. The twenty-second transistor T22 may include the sub-transistors T22-1 and T22-2 connected in series to each other. The twenty-second transistor T22 may include a first electrode connected to the first node Q, a second electrode that receives the third voltage VGL, and a gate electrode that receives the reset signal ESR.

The path selector 306 may select at least one of two or more paths between the first node Q and the carry signal output component 307 (or the emission signal output component 308) and conduct electricity through the selected at least one path. The two or more paths may include a path including a node Q_F1 and a path including a node Q_F2. The path selector 306 may select and use different paths on a frame basis so that stress of the transistors that are located or disposed on each path can be mitigated. In an embodiment, the path selector 306 may simultaneously select and use the path including the node Q_F1 and the path including the node Q_F2.

The path selector 306 may include a third transistor T3, a fourth transistor T4, a fifth transistor T5, a sixth transistor T6, a twenty-third transistor T23, and a twenty-fourth transistor T24. The fifth transistor T5 may include sub-transistors T5-1 and T5-2 connected in series to each other. The sixth transistor T6 may include sub-transistors T6-1 and T6-2 connected in series to each other.

The third transistor T3 may include a first electrode connected to the first node Q, a second electrode connected to the node Q_F1, and a gate electrode that receives a path select signal EMH_GBI1. The fourth transistor T4 may include a first electrode connected to the first node Q, a second electrode connected to the node Q_F2, and a gate electrode that receives a path select signal EMH_GBI2. The fifth transistor T5 may include a first electrode that receives the third voltage VGL, a second electrode connected to a first electrode of the twenty-third transistor T23, and a gate electrode that receives a path select signal EML_GBI1. The logic level of the path select signal EML_GBI1 may be opposite to that of the path select signal EMH_GBI1. The sixth transistor T6 may include a first electrode that receives the third voltage VGL, a second electrode connected to a first electrode of the twenty-fourth transistor T24, and a gate electrode that receives a path select signal EML_GBI2. The logic level of the path select signal EML_GBI2 may be opposite to that of the path select signal EMH_GBI2. The twenty-third transistor T23 may include the first electrode connected to the second electrode of the fifth transistor T5, a second electrode connected to the node Q_F1, and a gate electrode that receives the first voltage VGH. The twenty-fourth transistor T24 may include a first electrode connected to the second electrode of the sixth transistor T6, a second electrode connected to the node Q_F2, and a gate electrode that receives the first voltage VGH.

The voltage booster 305 may boost the voltage of a path selected by the path selector 306, based on the second clock signal CLK2. The voltage booster 305 may include a seventh transistor T7, an eighth transistor T8, a first capacitor C1, and a second capacitor C2.

The seventh transistor T7 may include a first electrode connected to a first electrode of the first capacitor C1, a second electrode connected to the second input terminal 102, and a gate electrode connected to the node Q_F1. The eighth transistor T8 may include a first electrode connected to the second input terminal 102, a second electrode connected to a second electrode of the second capacitor C2, and a gate electrode connected to the node Q_F2. The first capacitor C1 may be connected between the gate electrode of the seventh transistor T7 and the first electrode. The second capacitor C2 may be connected between the gate electrode of the eighth transistor T8 and the second electrode.

The carry signal output component 307 may output a carry signal CS1 having a turn-on level based on the voltage of the first node Q, and output a carry signal CS1 having a turn-off level based on the voltage of the second node QB. The carry signal output component 307 may include a ninth transistor T9, a tenth transistor T10, and an eleventh transistor T11.

The seventh transistor T7 may include a first electrode that receives the first voltage VGH, a second electrode connected to the second output terminal 202, and a gate electrode connected to the node Q_F1. The tenth transistor T10 may include a first electrode that receives the first voltage VGH, a second electrode connected to the second output terminal 202, and a gate electrode connected to the node Q_F2. The eleventh transistor T11 may include a first electrode connected to the second output terminal 202, a second electrode that receives the second voltage VGL2, and a gate electrode connected to the second node QB.

The emission signal output component 308 may output an emission signal ES1 having a turn-on level based on the voltage of the first node Q, and output an emission signal ES1 having a turn-off level based on the voltage of the second node QB. The emission signal output component 308 may include a twelfth transistor T12, a thirteenth transistor T13, a fourteenth transistor T14, a fourth capacitor C4, a fifth capacitor C5, and a sixth capacitor C6.

The twelfth transistor T12 may include a first electrode that receives the first voltage VGH, a second electrode connected to the first output terminal 201, and a gate electrode connected to the node Q_F1. The fourth capacitor C4 may be connected between the gate electrode of the twelfth transistor T12 and the second electrode. The thirteenth transistor T13 may include a first electrode that receives the first voltage VGH, a second electrode connected to the first output terminal 201, and a gate electrode connected to the node Q_F2. The fifth capacitor C5 may be connected between the gate electrode of the thirteenth transistor T13 and the second electrode. The fourteenth transistor T14 may include a first electrode connected to the first output terminal 201, a second electrode that receives the third voltage VGL, and a gate electrode connected to the second node QB. The sixth capacitor C6 may be connected between the gate electrode of the fourteenth transistor T14 and the second electrode.

Figure 7:
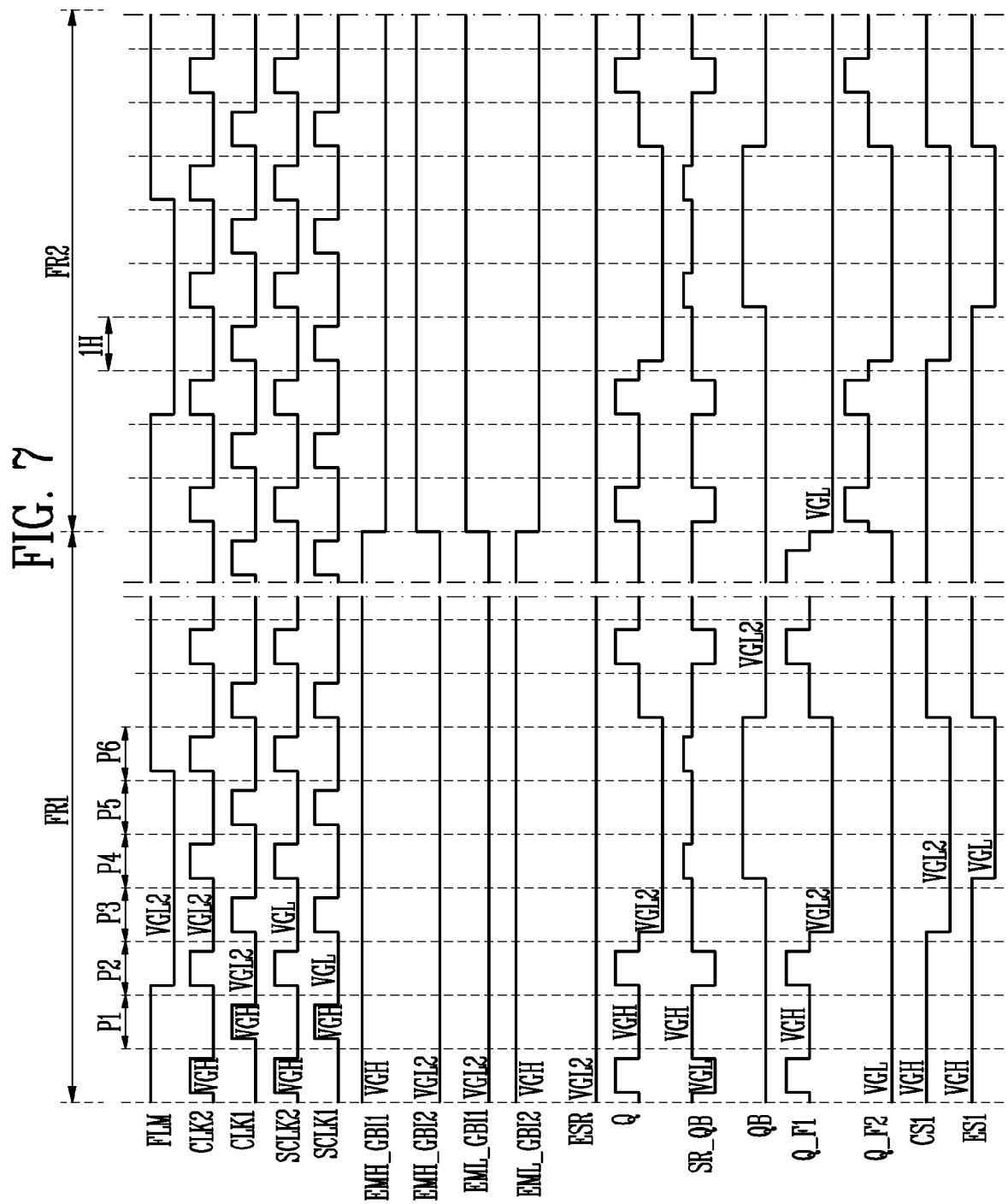
FIG. 7 is a schematic diagram for describing an example of a method of driving the stage of FIG. 6.

FIG. 7 is a schematic diagram for describing an example of a method of driving the stage of FIG. 6.

The first clock signal CLK1 and the first auxiliary clock signal SCLK1 may be signals which have the same cycle and phase and are different from each other in voltage level of at least one logic level. For example, the first clock signal CLK1 and the first auxiliary clock signal SCLK1 may be different from each other in voltage level of the logic low level thereof. The voltage level of the logic low level of the first auxiliary clock signal SCLK1 may be greater than that of the first clock signal CLK1. For example, the logic low level of the first auxiliary clock signal SCLK1 may correspond to the third voltage VGL, and the logic low level of the first clock signal CLK1 may correspond to the second voltage VGL2. For instance, the logic high level of the first auxiliary clock signal SCLK1 and the logic high level of the first clock signal CLK1 may correspond to the first voltage VGH.

The second clock signal CLK2 and the second auxiliary clock signal SCLK2 may be signals which have the same cycle and phase and are different from each other in voltage level of at least one logic level. For example, the second clock signal CLK2 and the second auxiliary clock signal SCLK2 may be different from each other in voltage level of the logic low level thereof. The voltage level of the logic low level of the second auxiliary clock signal SCLK2 may be greater than that of the second clock signal CLK2. For example, the logic low level of the second auxiliary clock signal SCLK2 may correspond to the third voltage VGL, and the logic low level of the second clock signal CLK2 may correspond to the second voltage VGL2. For instance, the logic high level of the second auxiliary clock signal SCLK2 and the logic high level of the second clock signal CLK2 may correspond to the first voltage VGH.

In an embodiment, the logic levels of the path select signals EMH_GBI1, EMH_GBI2, EML_GBI1, EML_GBI2 may be inverted on a frame period basis. For example, during the first frame period FR1, the path select signal EMH_GBI1 may be at a logic high level, and the path select signal EMH_GBI2 may be at a logic low level. During the second frame period FR2, the path select signal EMH_GBI1 may be at a logic low level, and the path select signal EMH_GBI2 may be at a logic high level. As described above, the path select signal EML_GBI1 may have a logic level opposite to that of the path select signal EMH_GBI1. Furthermore, the path select signal EML_GBI2 may have a logic level opposite to that of the path select signal EMH_GBI2. In an embodiment of FIG. 6, during the first frame period RF1, the path through the node Q_F1 may be enabled, and the path through the node Q_F2 may be disabled. Furthermore, during the second frame period RF2, the path through the node Q_F1 may be disabled, and the path through the node Q_F2 may be enabled. Hence, stress of the transistors of the disabled path may be mitigated.

In an embodiment, during successive periods FR1, FR2, . . . , the path select signals EMH_GBI1 and EMH_GBI2 may be maintained at a logic high level. Here, during the successive periods FR1, FR2, . . . , the path select signals EML_GBI1 and EML_GBI2 may be maintained at a logic low level. In the foregoing embodiment, during the successive frame periods FR1, FR2, . . . , the path through the nodes Q_F1 and Q_F2 may be enabled.

First, during a first period P1, the first transistor T1 may be turned on by the first clock signal CLK1 having a logic high level. Here, because the emission stop signal FLM is at a logic high level, the first node Q may be charged to a logic high level. As the first node Q is charged to a logic high level, the twenty-first transistor T21 and the sixteenth transistor T16 may be turned on. As described above, to prevent current from leaking from the first node Q, the twenty-first transistor T21 may transmit the first voltage VGH to the node between the sub-transistors T1-1 and T1-2 of the first transistor T1, the node between the sub-transistors T2-1 and T2-2 of the second transistor T2, and the node between the sub-transistors T22-1 and T22-2 of the twenty-second transistor T22.

During the first period P1, because the first auxiliary clock signal SCLK1 is at a logic high level, the node SR_QB may be charged with the first voltage VGH through the turned-on fifteenth transistor T15. Because the third transistor T3 is in a turned-on state by the path select signal EMH_GBI1 that is at a logic high level, the node Q_F1 may also be charged to a logic high level. Here, since the transistor T4 is in a turned-off state by the path select signal EMH_GBI2 that is at a logic low level, the node Q_F2 may be maintained at a logic low level without a change in voltage.

During the first period P1, the carry signal CS1 having a logic high level corresponding to the first voltage VGH may be outputted through the turned-on ninth transistor T9, and the emission signal ES1 having a logic high level corresponding to the first voltage VGH may be outputted through the turned-on twelfth transistor T12.

During a second period P2, the emission stop signal FLM having a logic low level may be supplied. However, because the first transistor T1 is in a turned-off state by the first clock signal CLK1 having a logic low level, the stage ST1a may not be affected by the emission stop signal FLM.

During the second period P2, as the second clock signal CLK2 having a logic high level is supplied, the voltage of the first electrode of the first capacitor C1 may increase to a logic high level through the turned-on seventh transistor T7. Hence, the voltage of the second electrode of the first capacitor C1 increases, so that the voltages of the nodes Q and Q_F1 may be boosted to be higher than the first voltage VGH. Because the second voltage VGL2 is supplied through a twentieth transistor T20 that is in a turned-on state, the second node QB may be maintained at a logic low level. Here, because the first auxiliary clock signal SCLK1 having a logic low level is supplied through the sixteenth transistor T16 that is in a turned-on state, the node SR_QB may be discharged to a logic low level.

During a third period P3, the first transistor T1 may be turned on by the emission stop signal FLM having a logic low level and the first clock signal CLK1 having a logic high level, and the nodes Q and Q_F1 may be discharged to a logic low level through the first transistor T1. Because the first auxiliary clock signal SCLK1 is at a logic high level, the node SR_QB may be charged with the first voltage VGH through the turned-on fifteenth transistor T15.

During a fourth period P4, the second clock signal CLK2 having a logic high level may turn on the nineteenth transistor T19 through the eighteenth transistor T18. The second node QB may be charged with the first voltage VGH through the turned-on nineteenth transistor T19. Hence, the eleventh transistor T11 may be turned on, and the carry signal CS1 having a logic low level may be outputted. Furthermore, the fourteenth transistor T14 may be turned on, and the emission signal ES1 having a logic low level may be outputted. Here, the voltage of the node SR_QB may be boosted by the third capacitor C3.

The operation of the stage ST1a in a fifth period P5 may be the same as that of the stage ST1a in the third period P3. The operation of the stage ST1a in a sixth period P6 may be the same as that of the stage ST1a in the fourth period P4.

In accordance with an embodiment, even if the threshold voltage of the sixteenth transistor T16 is negatively shifted, the node SR_QB may be reliably maintained at a logic high level during the fourth period P4. The threshold voltage of the sixteenth transistor T16 may become less than 0 for various reasons such as a problem in a fabrication process, degradation over time, and hysteresis.

If the second node voltage setting component 302 uses the existing first clock signal CLK1 without using the first auxiliary clock signal SCLK1, the second voltage VGL2 will be applied to the second electrode of the sixteenth transistor T16 during the fourth period P4. Because the voltage of the first node Q is the second voltage VGL2, the gate-source voltage of the sixteenth transistor T16 becomes 0, so that the sixteenth transistor T16 is undesirably turned on. Hence, during the fourth period P4, charges of the node SR_QB may leak to the fourth input terminal 104, so that the node SR_QB cannot be maintained at a logic high level. Thus, the eighteenth transistor T18 is turned off, so that the nineteenth transistor T19 cannot be turned on despite the second clock signal CLK2 having a logic high level. As a result, the second node QB cannot be charged to a logic high level.

However, in accordance with an embodiment, because the second node voltage setting component 302 uses the first auxiliary clock signal SCLK1, the third voltage VGL may be applied to the second electrode of the sixteenth transistor T16 during the fourth period P4. Because the voltage of the first node Q is the second voltage VGL2, the gate-source voltage of the sixteenth transistor T16 becomes less than 0, so that the sixteenth transistor T16 can be reliably turned off. As described above, the third voltage VGL may be set to be greater than the second voltage VGL2. Therefore, during the fourth period P4, the node SR_QB may be stably maintained at a logic high level. As a result, the second node QB may be reliably charged to a logic high level.

Figure 8:
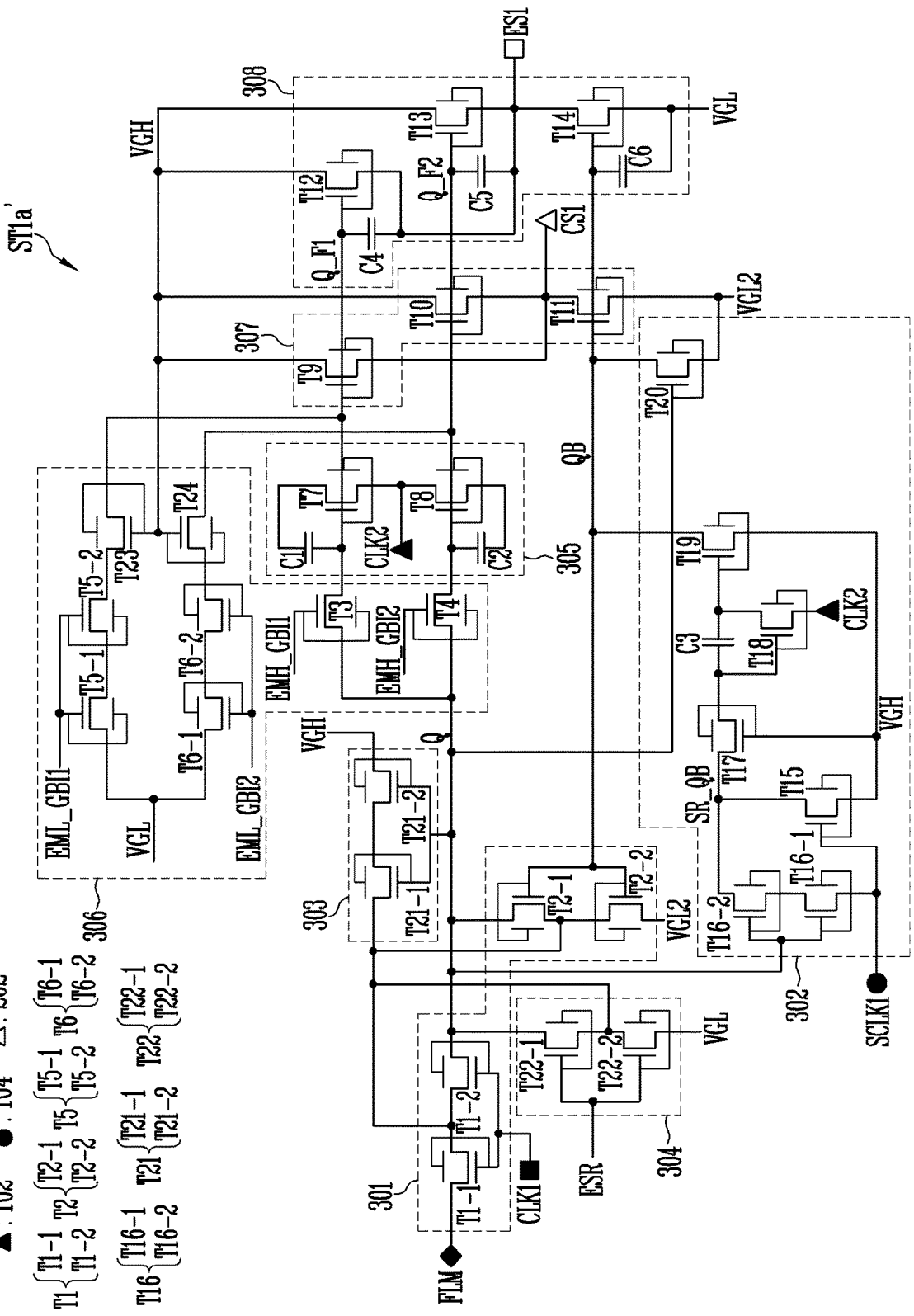
FIG. 8 is a schematic diagram for describing a modification of the stage of FIG. 6.

FIG. 8 is a schematic diagram for describing a modification of the stage of FIG. 6.

Compared to the stage ST1a of FIG. 6, in a stage ST1a' of FIG. 8, each of the transistors T1 to T24 may further include a back-gate electrode. The back-gate electrode of each of the transistors T1 to T24 may be connected to a corresponding gate electrode. Thus, on-current of the transistors T1 to T24 may be increased, and the back-gate electrode may also function to block light.

Figure 9:
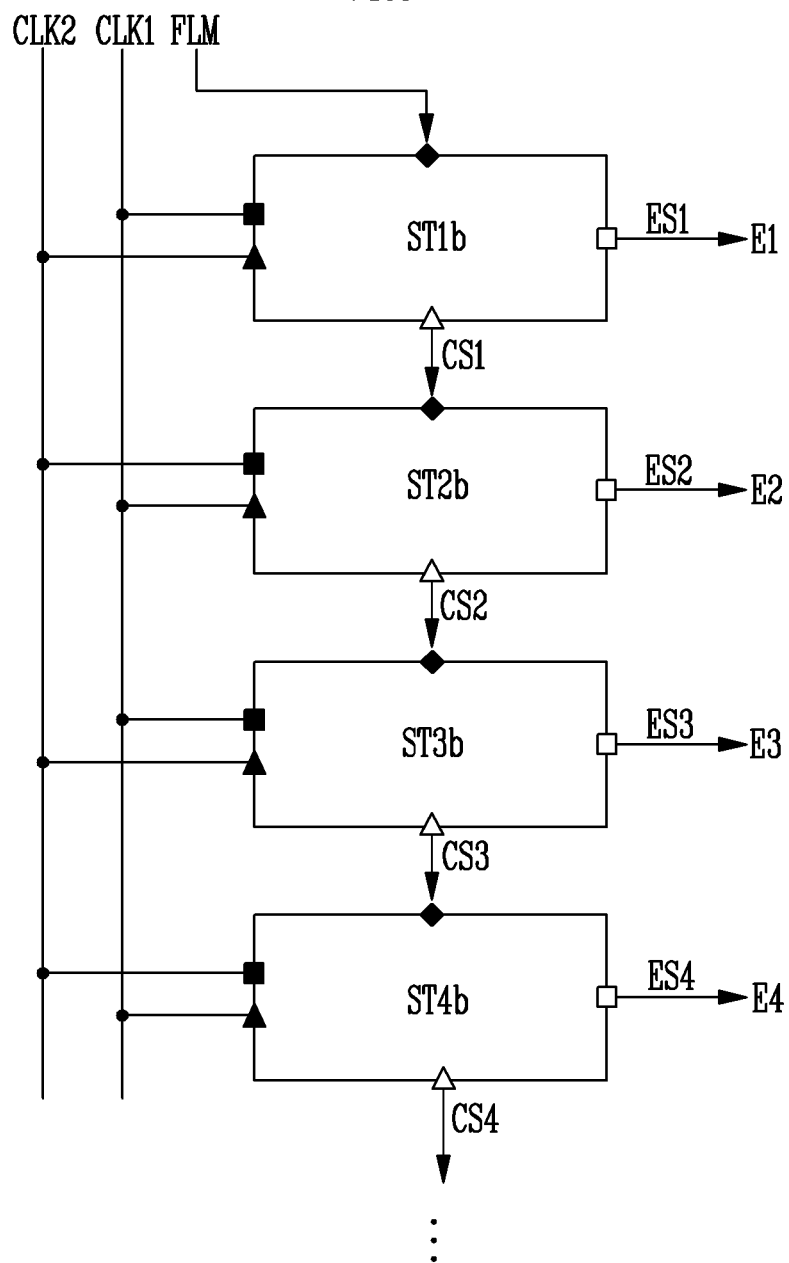
FIG. 9 is a schematic diagram for describing an emission driver in accordance with an embodiment.

FIG. 9 is a schematic diagram for describing an emission driver 16b in accordance with an embodiment.

The emission driver 16b of FIG. 9 may include stages ST1b, ST2b, ST3b, ST4b, . . . . Compared to the emission driver 16a of FIG. 4, in the emission driver 16b of FIG. 9, each of the stages ST1b, ST2b, ST3b, ST4b, . . . may not include a fourth input terminal 104. In other words, the stages ST1b, ST2b, ST3b, ST4b, . . . may not receive a first auxiliary clock signal or a second auxiliary clock signal.

Figure 10:
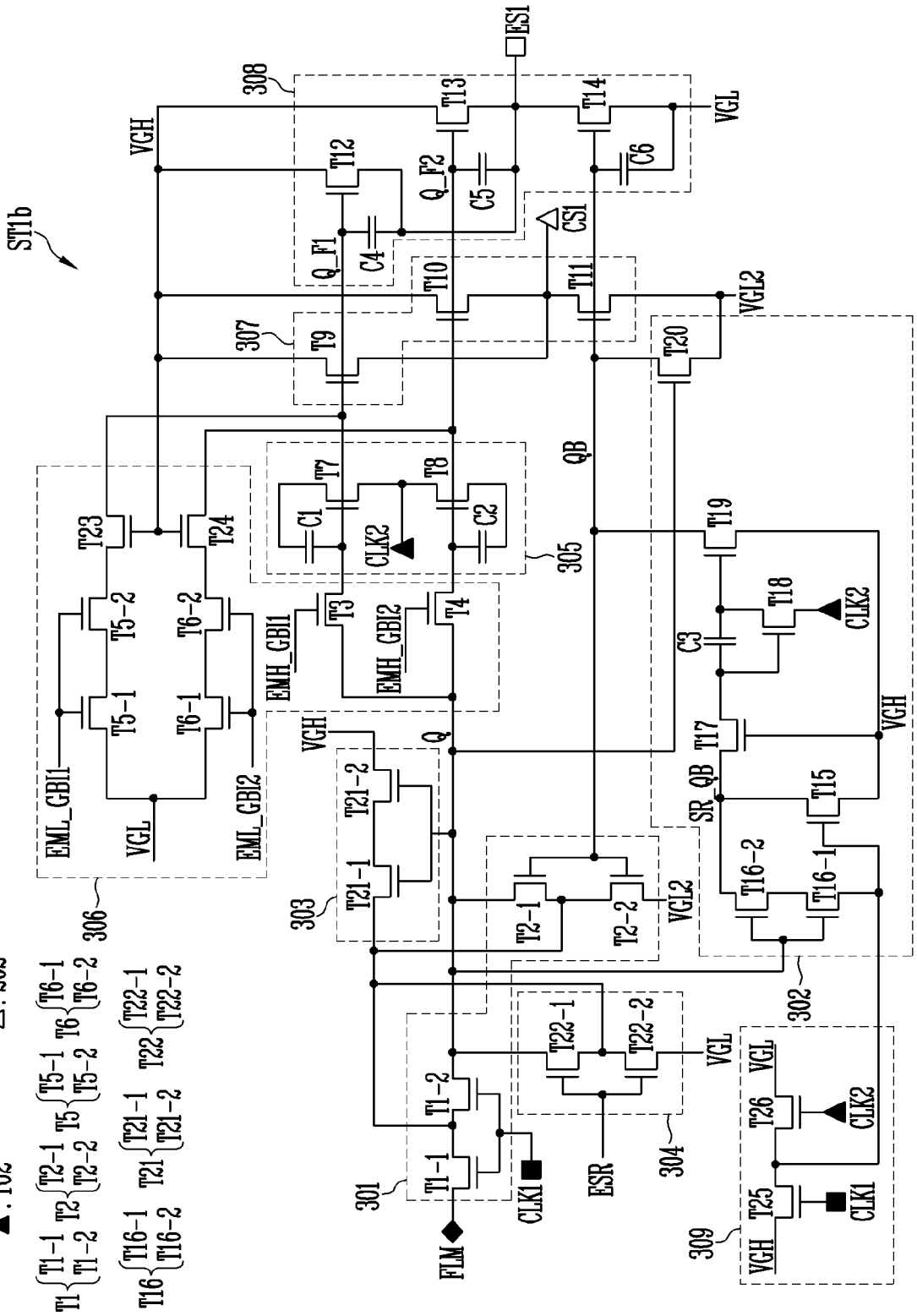
FIG. 10 is a schematic diagram for describing a stage in accordance with an embodiment.

FIG. 10 is a schematic diagram for describing a stage in accordance with an embodiment.

Referring to FIG. 10, a schematic circuit diagram of the configuration of a first stage ST1b of the emission driver 16b of FIG. 9 is illustrated as a representative example. The stage ST1b may be different from the stage ST1a of FIG. 6 in that the stage ST1b may further include a control signal provider 309.

The control signal provider 309 may provide a control signal having a first level based on a first clock signal CLK1, and may provide a control signal having a second level based on a second clock signal CLK2. The control signal having the first level may correspond to the first voltage VGH. The control signal having the second level may correspond to the third voltage VGL. Here, the control signal has the same function as that of the first auxiliary clock signal SCLK1 of FIG. 8; therefore, redundant explanation thereof will be omitted.

The control signal provider 309 may include a twenty-fifth transistor T25 and a twenty-sixth transistor T26. The twenty-fifth transistor T25 may include a first electrode that receives the first voltage VGH, a second electrode connected to the gate electrode of the fifteenth transistor T15, and a gate electrode connected to the first input terminal 101. The twenty-sixth transistor T26 may include a first electrode connected to the gate electrode of the fifteenth transistor T15, a second electrode that receives the third voltage VGL, and a gate electrode connected to the second input terminal 102.

Figure 11:
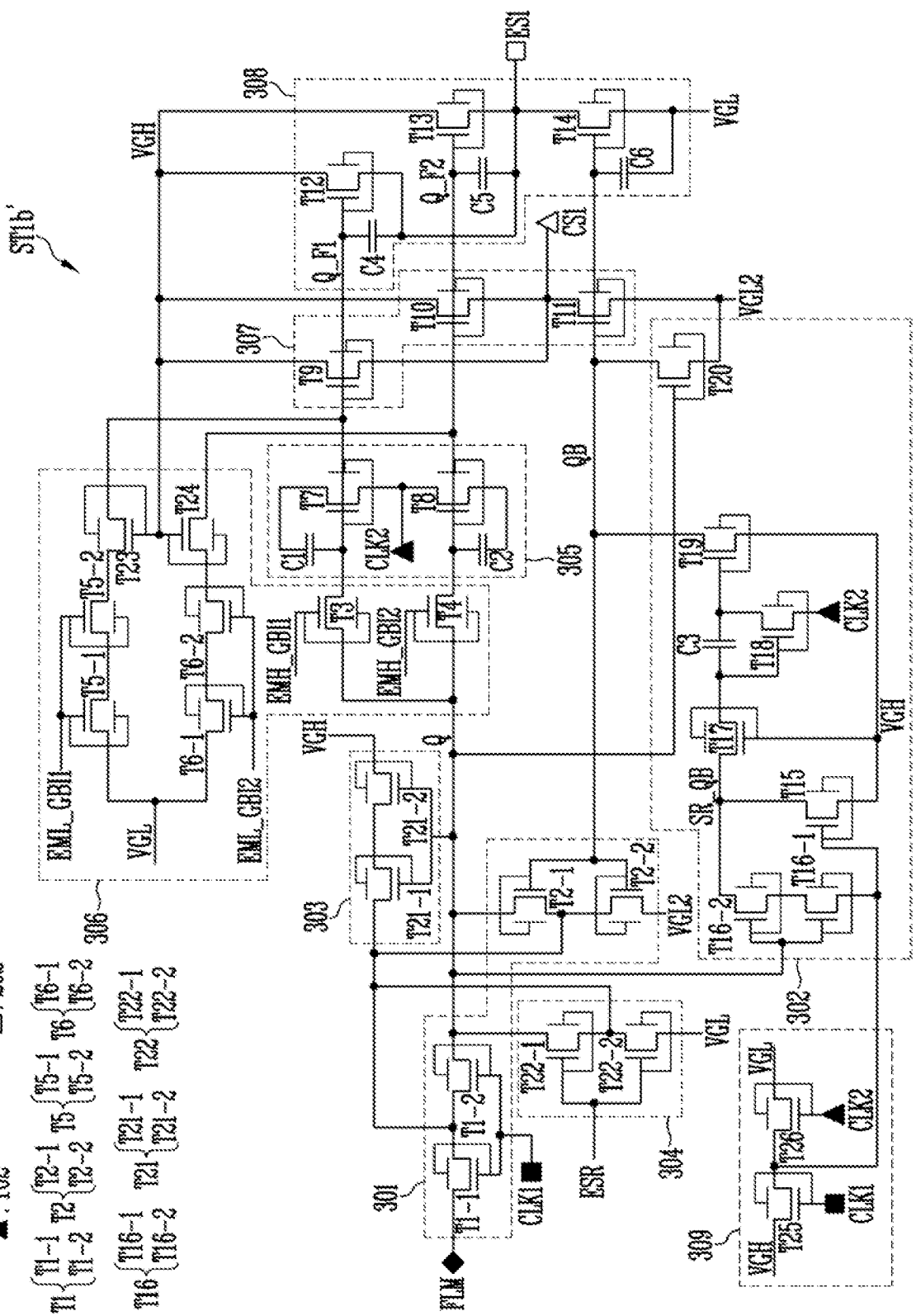
FIG. 11 is a schematic diagram for describing a modification of the stage of FIG. 10.

FIG. 11 is a schematic diagram for describing a modification of the stage of FIG. 10.

Compared to the stage ST1b of FIG. 10, in a stage ST1b' of FIG. 11, each of the transistors T1 to T26 may further include a back-gate electrode. The back-gate electrode of each of the transistors T1 to T26 may be connected to a corresponding gate electrode. Thus, on-current of the transistors T1 to T26 may be increased, and the back-gate electrode may also function to block light.

An emission driver and a display device including the emission driver in accordance with an embodiment may be normally operated even if the threshold voltage of the internal transistor is negatively shifted.

Although embodiments have been disclosed for illustrative purposes, those skilled in the art will appreciate that various modifications, additions and substitutions are possible, without departing from the scope and spirit of the disclosure and as disclosed in the accompanying claims. Accordingly, the bounds and scope of the disclosure should be determined by the technical spirit of the following claims.

What is claimed is:

1. An emission driver comprising:
   stages including a first group of stages, wherein
   each of the stages of the first group among the stages comprises:
   a first carry signal output component that outputs a carry signal having a turn-on level based on a voltage of a first node, and outputs the carry signal having a turn-off level based on a voltage of a second node;
   a first emission signal output component that outputs an emission signal having a turn-on level based on the voltage of the first node, and outputs the emission signal having a turn-off level based on the voltage of the second node;
   a first node voltage setting component that sets the voltage of the first node based on a preceding carry signal or an emission stop signal, the voltage of the second node, and a first clock signal; and a second node voltage setting component that sets the voltage of the second node based on the voltage of the first node, a second clock signal, and a first auxiliary clock signal, wherein the first clock signal and the second clock signal are identical in cycle and are different in phase, the first clock signal and the first auxiliary clock signal are identical in cycle and phase and are different in a voltage level of at least one logic level, and the first clock signal and the first auxiliary clock signal are different in a voltage level of a logic low level.

2. The emission driver according to claim 1, wherein the voltage level of the logic low level of the first auxiliary clock signal is greater than the voltage level of the logic low level of the first clock signal.

3. The emission driver according to claim 1, wherein each of the stages of the first group among the stages further comprises a leakage current interrupter that interrupts a leakage current path connected to the first node, based on the voltage of the first node.

4. The emission driver according to claim 3, wherein the leakage current path is located in the first node voltage setting component.

5. The emission driver according to claim 1, wherein each of the stages of the first group among the stages further comprises a reset component that resets the voltage of the first node based on a reset signal.

6. The emission driver according to claim 1, wherein each of the stages of the first group among the stages further comprises a path selector that selects at least one path between the first node and the first carry signal output component or the first emission signal output component and conducts electricity through the selected at least one path.

7. The emission driver according to claim 6, wherein each of the stages of the first group among the stages further comprises a voltage booster that boosts, based on the second clock signal, a voltage of the at least one path selected by the path selector.

8. The emission driver according to claim 1, wherein each of stages of a second group among the stages comprises:
a second carry signal output component that outputs a carry signal having a turn-on level based on a voltage of a third node, and outputs the carry signal having a turn-off level based on a voltage of a fourth node;
a second emission signal output component that outputs an emission signal having a turn-on level based on the voltage of the third node, and outputs the emission signal having a turn-off level based on the voltage of the fourth node;
a third node voltage setting component that sets the voltage of the third node based on a preceding carry signal, the voltage of the fourth node, and the second clock signal; and
a fourth node voltage setting component that sets the voltage of the fourth node based on the voltage of the third node, the first clock signal, and a second auxiliary clock signal, and the second clock signal and the second auxiliary clock signal are identical in cycle and phase and are different in a voltage level of at least one logic level.

9. The emission driver according to claim 8, wherein the stages of the first group and the stages of the second group are alternately arranged.

10. The emission driver according to claim 8, wherein the second clock signal and the second auxiliary clock signal are different in a voltage level of a logic low level.

11. The emission driver according to claim 10, wherein the voltage level of the logic low level of the second auxiliary clock signal is greater than the voltage level of the logic low level of the second clock signal.

12. An emission driver comprising:
stages of a first group among the stages, each of the stages of the first group among the stages comprise:
a first carry signal output component that outputs a carry signal having a turn-on level based on a voltage of a first node, and outputs the carry signal having a turn-off level based on a voltage of a second node;
a first emission signal output component that outputs an emission signal having a turn-on level based on the voltage of the first node, and outputs the emission signal having a turn-off level based on the voltage of the second node;
a first node voltage setting component that sets the voltage of the first node based on a preceding carry signal or an emission stop signal, the voltage of the second node, and a first clock signal;
a first control signal provider that provides a first control signal having a first level based on the first clock signal, and provides the first control signal having a second level based on a second clock signal; and
a second node voltage setting component that sets the voltage of the second node based on the voltage of the first node, the second clock signal, and the first control signal, wherein
the first clock signal and the second clock signal are identical in cycle and are different in phase,
the first clock signal and the first control signal are identical in cycle and phase and are different in a voltage level of at least one logic level, and
the first clock signal and the first control signal are different from each other in a voltage level of a logic low level.

13. The emission driver according to claim 12, wherein the voltage level of the logic low level of the first control signal is greater than the voltage level of the logic low level of the first clock signal.

14. The emission driver according to claim 12, wherein each of stages of a second group among the stages comprises:
a second carry signal output component that outputs a carry signal having a turn-on level based on a voltage of a third node, and outputs the carry signal having a turn-off level based on a voltage of a fourth node;
a second emission signal output component that outputs an emission signal having a turn-on level based on the voltage of the third node, and outputs the emission signal having a turn-off level based on the voltage of the fourth node;
a third node voltage setting component that sets the voltage of the third node based on a preceding carry signal, the voltage of the fourth node, and the second clock signal;
a second control signal provider that provides a second control signal having a first level based on the second clock signal, and provides the second control signal having a second level based on the first clock signal; and a fourth node voltage setting component that sets the voltage of the fourth node based on the voltage of the third node, the first clock signal, and the second control signal, and the second clock signal and the second control signal are identical in cycle and phase and are different in a voltage level of at least one logic level.

15. The emission driver according to claim 14, wherein the stages of the first group and the stages of the second group are alternately arranged.

16. The emission driver according to claim 14, wherein the second clock signal and the second control signal are different in a voltage level of a logic low level.

17. The emission driver according to claim 16, wherein the voltage level of the logic low level of the second control signal is greater than the voltage level of the logic low level of the second clock signal.

18. The emission driver according to claim 17, wherein the first control signal and the second control signal are identical in cycle and are different in phase.

* * * * *